United States Patent
Lee et al.

(10) Patent No.: US 8,018,564 B2
(45) Date of Patent: Sep. 13, 2011

(54) LIQUID CRYSTAL DISPLAY DEVICE HAVING A COMPOSITE DATA LINE WITH A LINE OPENING EXPOSING THE TOP SURFACE AND SIDEWALLS

(75) Inventors: Jung Il Lee, Gyeonggi-Do (KR); Seung Kwang Roh, Seoul (KR)

(73) Assignee: LG Display Co., Ltd., Seoul (KR)

( * ) Notice: Subject to any disclaimer, the term of this patent is extended or adjusted under 35 U.S.C. 154(b) by 227 days.

(21) Appl. No.: 11/821,162

(22) Filed: Jun. 22, 2007

(65) Prior Publication Data

US 2008/0143909 A1 Jun. 19, 2008

(30) Foreign Application Priority Data

Dec. 15, 2006 (KR) .................. 10-2006-0128468

(51) Int. Cl.
*G02F 1/1343* (2006.01)
*G02F 1/1333* (2006.01)

(52) U.S. Cl. ........................... 349/140; 349/138
(58) Field of Classification Search .................. 349/140, 349/148, 43, 138, 139
See application file for complete search history.

(56) References Cited

U.S. PATENT DOCUMENTS

| | | | | |
|---|---|---|---|---|
| 5,994,721 A * | 11/1999 | Zhong et al. | ..................... | 257/89 |
| 6,380,559 B1 * | 4/2002 | Park et al. | ..................... | 257/59 |
| 6,969,889 B2 * | 11/2005 | Cho et al. | ..................... | 257/347 |
| 2002/0044229 A1 * | 4/2002 | Kim | ..................... | 349/43 |
| 2002/0151116 A1 * | 10/2002 | Matsubara | ..................... | 438/149 |
| 2004/0169812 A1 * | 9/2004 | Kim | ..................... | 349/187 |
| 2005/0041192 A1 * | 2/2005 | Kuo et al. | ..................... | 349/152 |
| 2006/0011921 A1 * | 1/2006 | Park et al. | ..................... | 257/72 |
| 2006/0049403 A1 * | 3/2006 | Byun et al. | ..................... | 257/59 |
| 2006/0098154 A1 * | 5/2006 | Kim et al. | ..................... | 349/187 |

FOREIGN PATENT DOCUMENTS

| CN | 1508612 | 6/2004 |
|---|---|---|
| JP | 2002-40479 A | 2/2002 |

OTHER PUBLICATIONS

English Translation of previously submitted Office Action issued in corresponding Japanese Patent Application No. 2007-172210 (issued Jun. 21, 2010).

* cited by examiner

*Primary Examiner* — David Nelms
*Assistant Examiner* — Paul C Lee
(74) *Attorney, Agent, or Firm* — Brinks Hofer Gilson & Lione (57) ABSTRACT

An LCD device includes plurality of gate lines and data lines crossing each other to define pixel regions on a substrate. A thin film transistor (TFT) resides at a crossing portion of the gate lines and the data lines and a pixel electrode is electrically connected with the TFT. The TFT includes a gate electrode, a gate insulation layer on the gate electrode and a semiconductor layer on the gate insulation layer. A portion of the data line and the semiconductor layer form a composite layer between adjacent pixel electrodes in which a line width of data line is the same as a line width of semiconductor layer. A method of fabricating the LCD device includes etching a passivation layer using a mask pattern and etching the semiconductor layer using the mask pattern and a portion of the data line as an etch mask to form the composite layer.

11 Claims, 11 Drawing Sheets

LIQUID CRYSTAL DISPLAY DEVICE HAVING A COMPOSITE DATA LINE WITH A LINE OPENING EXPOSING THE TOP SURFACE AND SIDEWALLS

This application claims the benefit of Korean Patent Application No. 2006-128468 filed on Dec. 15, 2006, which is hereby incorporated by reference as if fully set forth herein.

TECHNICAL FIELD

The present invention relates to a liquid crystal display (LCD) device and a method of fabricating the same and, more particularly, to an LCD device to improve an aperture ratio by decreasing a line width of semiconductor layer provided below a data line, and a method of fabricating the same.

BACKGROUND

Discussion of the Related Art

Recently, LCD devices have received increased attention because they offer a high-tech, high-value added product in which the LCD device has low power consumption and good portability.

Generally, the LCD device includes a thin film transistor array substrate, a color filter array substrate and a liquid crystal layer, wherein the liquid crystal layer is formed between the thin film transistor array substrate and the color filter array substrate.

The thin film transistor array substrate includes a plurality of gate and lines crossing each other to define a plurality of pixel regions; a plurality of thin film transistors corresponding to switching elements, wherein each thin film transistor is provided adjacent to a crossing portion of the gate and data lines; and a plurality of pixel electrodes respectively formed in the pixel regions.

The color filter array substrate includes color filters to represent various colors; and a black matrix to divide the color filters and to prevent light leakage.

The thin film transistor array substrate is fabricated by a plurality of semiconductor processes and mask processes, whereby the fabrication process of the thin film transistor array substrate is complicated, and the fabrication cost thereof is increased.

Accordingly, a new method has been proposed to decrease the mask processes, wherein a semiconductor layer pattern, a data line pattern and a source/drain pattern including source and drain electrodes are completed by one mask process. That is, a first etching process is provided to form the source/drain pattern and semiconductor layer having the same pattern, and a second etching process is provided to separate the source and drain electrodes from each other.

Using this method, the semiconductor layer may be fabricated by one etching step. However, the data line positioned on the semiconductor layer is fabricated by two etching steps. Thus, the line width of the data line is smaller than the line width of semiconductor layer positioned under the data line.

Accordingly, the semiconductor layer protrudes toward the pixel region at both sides of the data line. In order to decrease the influence of parasitic capacitance, the pixel electrode of pixel region is formed at a predetermined distance from the data line and the semiconductor layer. As a result, the area of pixel electrode is decreased in proportion to the distance that semiconductor layer protrudes beyond the data line.

SUMMARY

In one embodiment, an LCD device includes a substrate including a plurality of gate lines and a plurality of data lines crossing each other to define a plurality of pixel regions on the substrate. A thin film transistor (TFT) resides at crossing portions of the gate lines and the data lines, each TFT including a semiconductor layer electrically coupled to a corresponding data line and a drain electrode electrically coupled to a pixel electrode. The data lines and the semiconductor layer make a composite line in regions on the substrate between adjacent pixel electrodes in which a line width of the data line is substantially the same as a line width of the semiconductor layer.

In another embodiment, an LCD device includes a substrate including a gate line and a data line crossing each other to define a pixel region on the substrate. A thin film transistor (TFT) resides at a crossing portion of the gate line and the data line. The TFT includes a gate electrode connected to the gate line, a gate insulation layer overlying the gate electrode, a semiconductor layer overlying the gate insulation layer, a source electrode overlying the semiconductor layer and connected to the data line, and a drain electrode. A pixel electrode connected to the drain electrode, and a portion of the data line overlies a portion of the semiconductor layer in a region adjacent to the pixel electrode where a line width of the data line is substantially the same as a line width of the semiconductor layer in the region adjacent to the pixel electrode.

In yet another embodiment, a method for fabricating an LCD device includes forming a gate line and a gate electrode on a substrate and sequentially forming a gate insulating layer, a semiconductor layer, and a metal layer overlying the substrate and the gate line and the gate electrode. Source and drain electrodes and a data line are formed and a passivation layer is formed overlying the source and drain electrodes. A mask pattern is formed on passivation layer, in which the mask has an opening over a portion of the data line. The passivation layer is etched using the mask pattern and the semiconductor layer is etched using the mask pattern and a portion of the data line as an etch mask to form a composite layer in which the semiconductor layer and the portion of the data line have substantially the same line width.

It is to be understood that both the foregoing general description and the following detailed description of the present invention are exemplary and explanatory and are intended to provide further explanation of the invention as claimed.

BRIEF DESCRIPTION OF THE DRAWING

The accompanying drawings, which are included to provide a further understanding of the invention and are incorporated in and constitute a part of this application, illustrate embodiment(s) of the invention and together with the description serve to explain the principle of the invention. In the drawings:

FIGS. 4A to 4H are cross section views illustrating a method of fabricating the LCD device shown in FIG. 2.

DETAILED DESCRIPTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
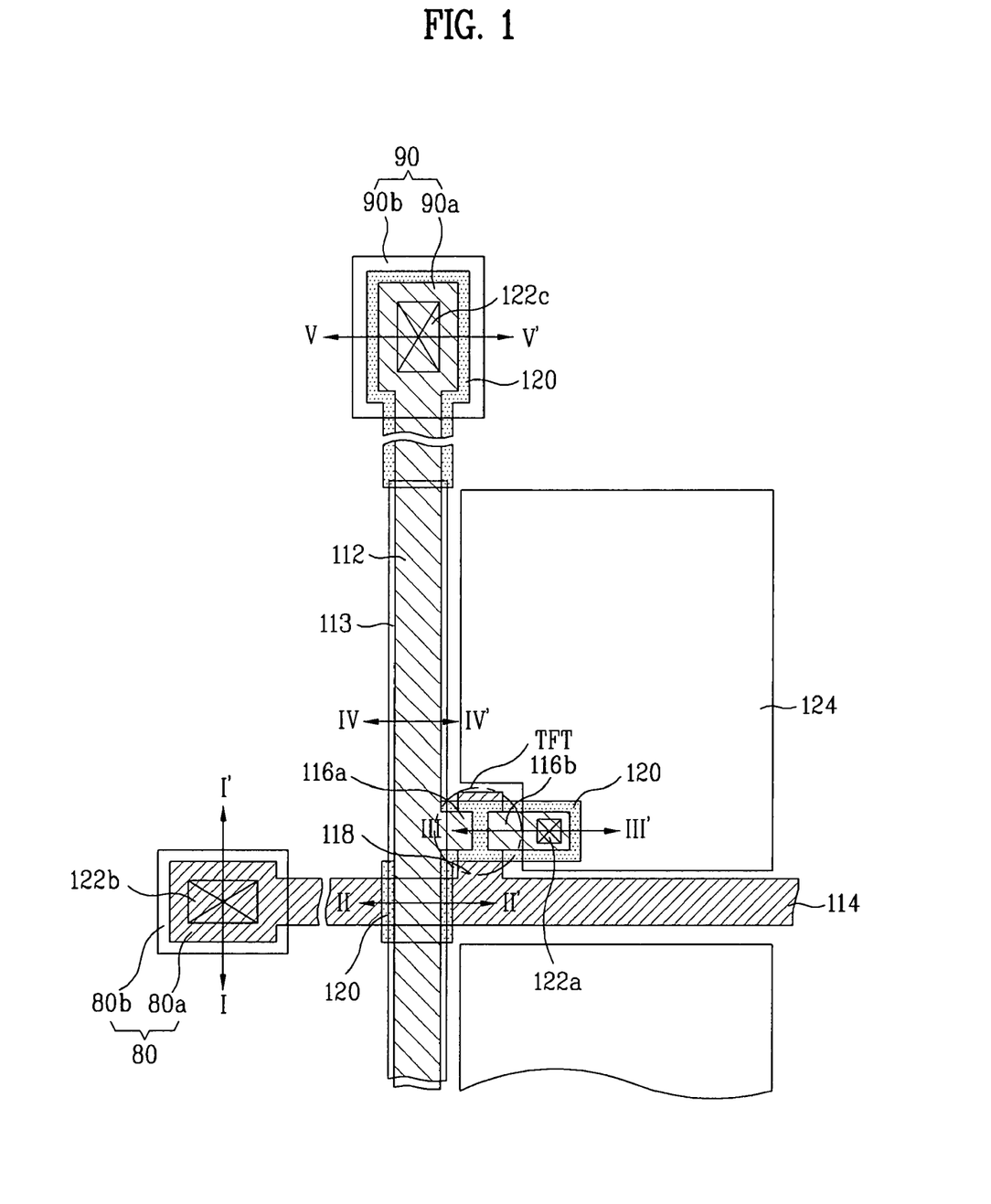
FIG. 1 is a plane view of illustrating an LCD device according to a preferred embodiment of the present invention.
Figure 2:
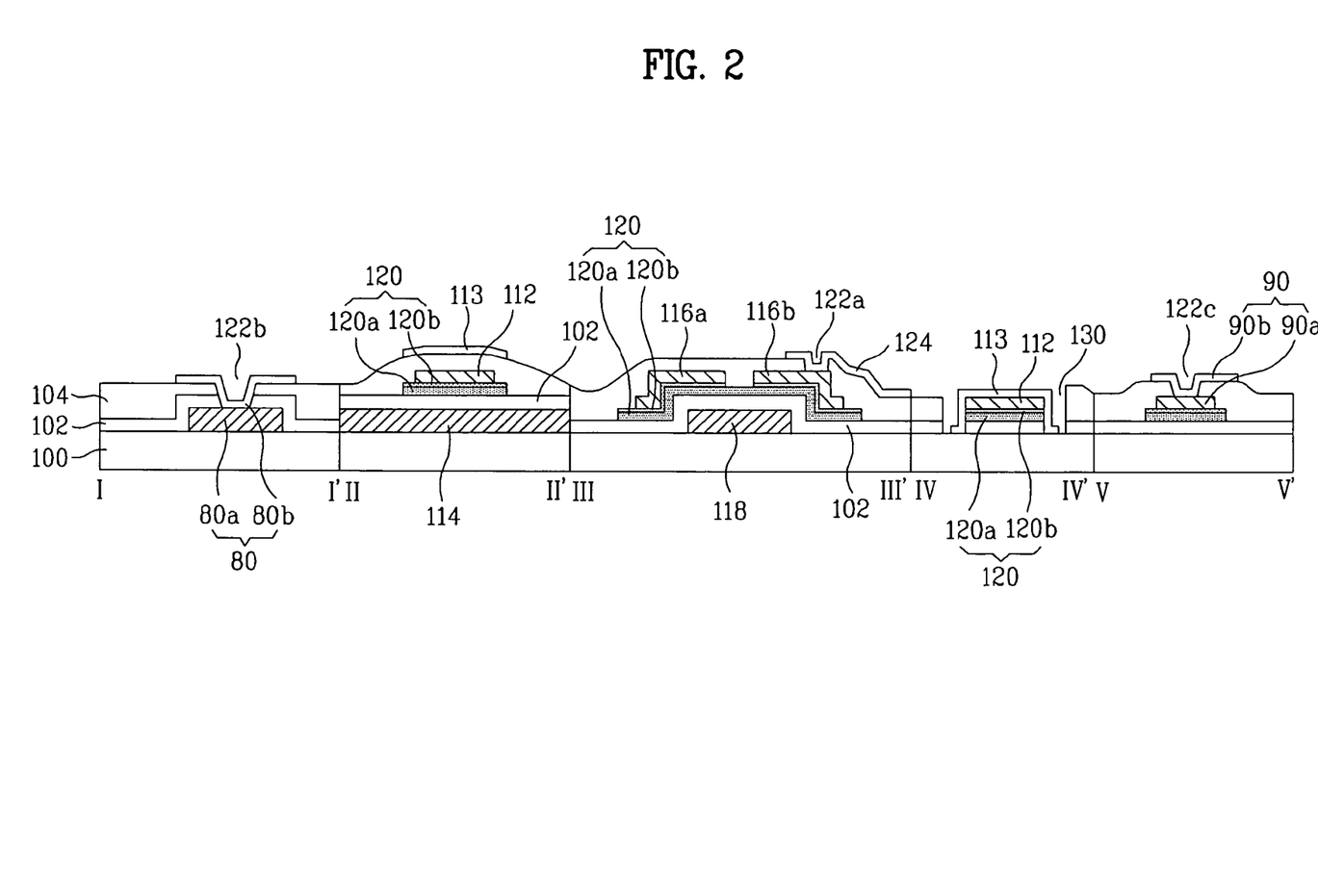
FIG. 2 is a cross section view of illustrating an alternative embodiment of an LCD device along section lines I-I' to V-V' of FIG. 1.

FIG. 1 is a plane view of illustrating an LCD device according to a preferred embodiment of the present invention. FIG. 2 is a cross section view of illustrating an LCD device along I-I' to V-V' of FIG. 1.

As illustrated in FIGS. 1 and 2, the LCD device according to the preferred embodiment of the present invention includes a gate line 114 and a data line 112 crossing each other to define a pixel region on a substrate 100; a thin film transistor (TFT) formed at a crossing portion of the gate line 114 and the data line 112; a pixel electrode 124 electrically connected with the thin film transistor (TFT) through a first contact hole 122a; a gate pad 80 electrically connected with the gate line 114; a data pad 90 electrically connected with the data line 112; a line hole 130 to expose the data line 112 and the periphery thereof; and a data passivation pattern 113 to surround the exposed data line 112. Those skilled in the art will realize that a display device includes many such pixel regions arranged in an array.

The thin film transistor (TFT) includes a gate electrode 118 diverged from the gate line 114; a gate insulation layer 102 formed on an entire surface of the substrate 100 including the gate electrode 118; a semiconductor layer 120 formed on the gate insulation layer 102 above the gate electrode 118; and source and drain electrodes 116a and 116b diverged from the data line 112 and formed at both sides of the semiconductor layer 120.

When the data line 112 is positioned on the semiconductor layer 120, a line width of data line 112 is the same as or is smaller than a line width of semiconductor layer 120.

The semiconductor layer 120 includes an active layer 120a and an ohmic contact layer 120b. The semiconductor layer 120 overlies the gate electrode 118 with the gate insulation layer 102 therebetween, and is also formed below the data line 112 and a data lower pad 90a. Importantly, if the semiconductor layer 120 is positioned below the data line 112 between the adjacent pixel electrodes 124, the line width of semiconductor layer 120 is the same as the line width of data line 112. If the semiconductor layer 120 is positioned at the crossing of the gate line 114 and the data line 112, the line width of semiconductor layer 120 is the same as or is larger than the line width of data line 112. In case of the semiconductor layer 120 below the data lower pad 90a, the line width of semiconductor layer 120 is the same as or is larger than the line width of data lower pad 90a.

The gate pad 80 includes a lower gate pad 80a extended from the gate line 114; and an upper gate pad 80b electrically connected with the lower gate pad 80a through a second contact hole 122b.

The data pad 90 includes a lower data pad 90a extended from the data line 112; and an upper data pad 90b electrically connected with the lower data pad 90a through a third contact hole 122c.

Then, a passivation layer 104 is formed on the source/drain pattern including the source and drain electrodes 116a and 116b, the data line 112 and the lower data pad 90a, wherein the passivation layer 104 exposes the drain electrode 116b, the lower data pad 90a and the data line 112.

Also, the upper gate pad 80b and the upper data pad 90b are formed on the same layer as the pixel electrode 124, and are formed of the same material as the pixel electrode 124.

Then, a data protection pattern 113 covers the upper and lateral sides of corresponding data line 112 exposed by the line hole 130 and the lateral side of semiconductor layer 120 positioned below the corresponding data line 112. At this time, the data protection pattern 113 is formed of the same material as that of the pixel electrode 124, and the data protection pattern 113 is formed in the line hole 130.

By removing the passivation layer 104 and gate insulation layer 102 surrounding the data line 112, the line hole 130 exposes the upper surface of substrate 100 as well as the data line 112.

Figure 3:
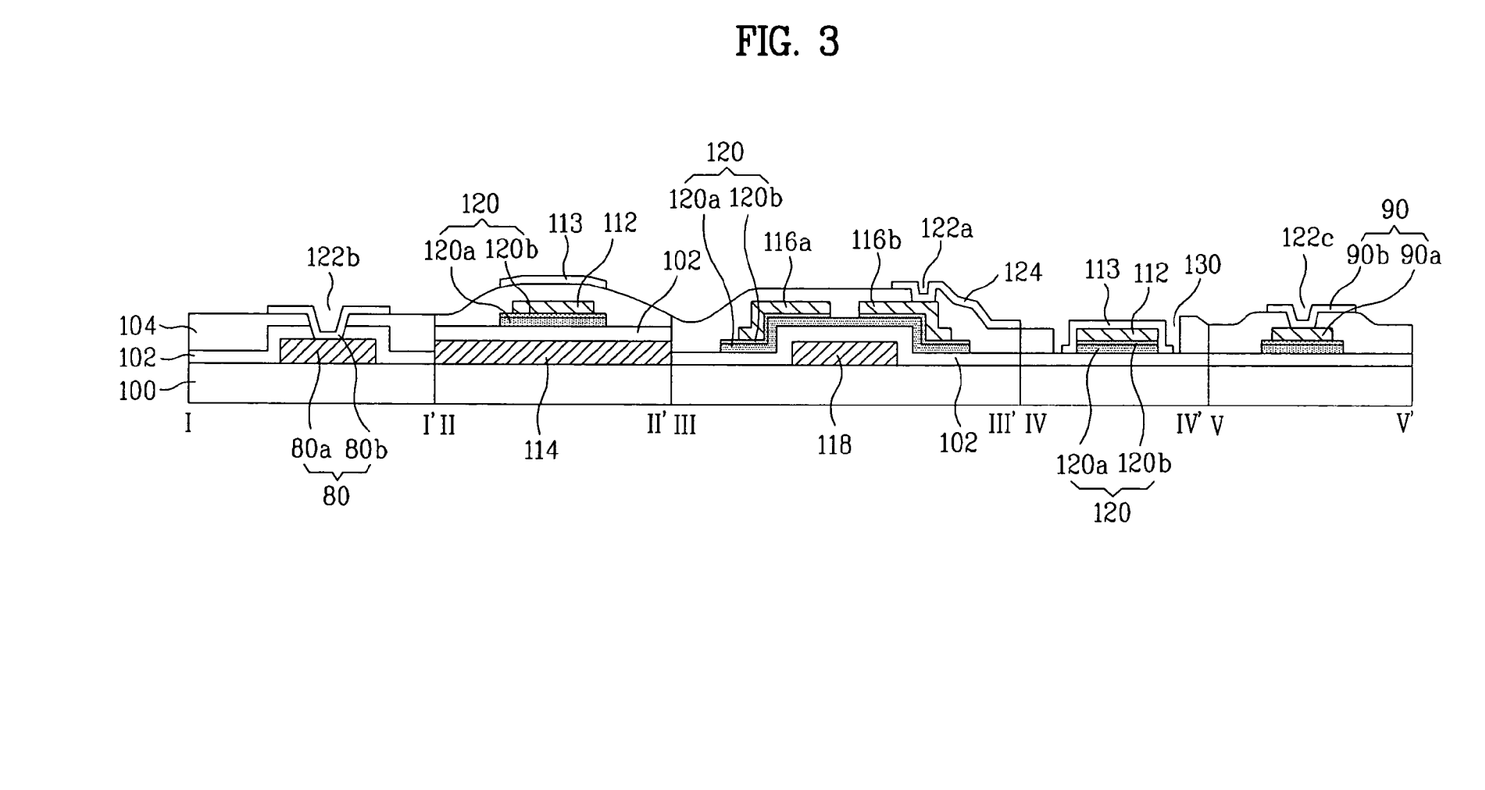
FIG. 3 is a cross section view of illustrating another LCD device along section lines I-I' to V-V' of FIG. 1.

In addition, the line hole 130 may be formed as shown in FIG. 3. As shown in FIG. 3, the line hole 130 exposes the data line 112 and the upper surface of gate insulation layer 102 by removing the passivation layer 104 surrounding the data line 112.

FIGS. 4A to 4H are cross section views illustrating a method of fabricating an LCD device shown in FIG. 2.

Figure 4A:
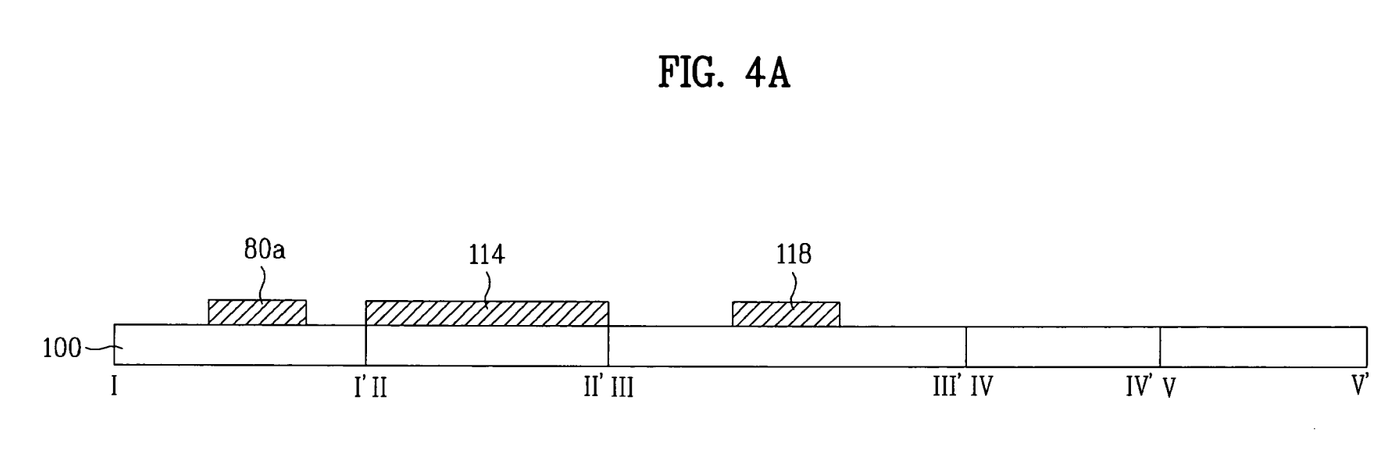

First, as illustrated in FIG. 4A, a gate metal layer is formed on the substrate 100 by a deposition method using sputtering. Then, the gate metal layer is patterned by photolithography, whereby a gate pattern including the gate line 114, the gate electrode 118 and the lower gate pad 80a is formed on the substrate 100.

Figure 4B:
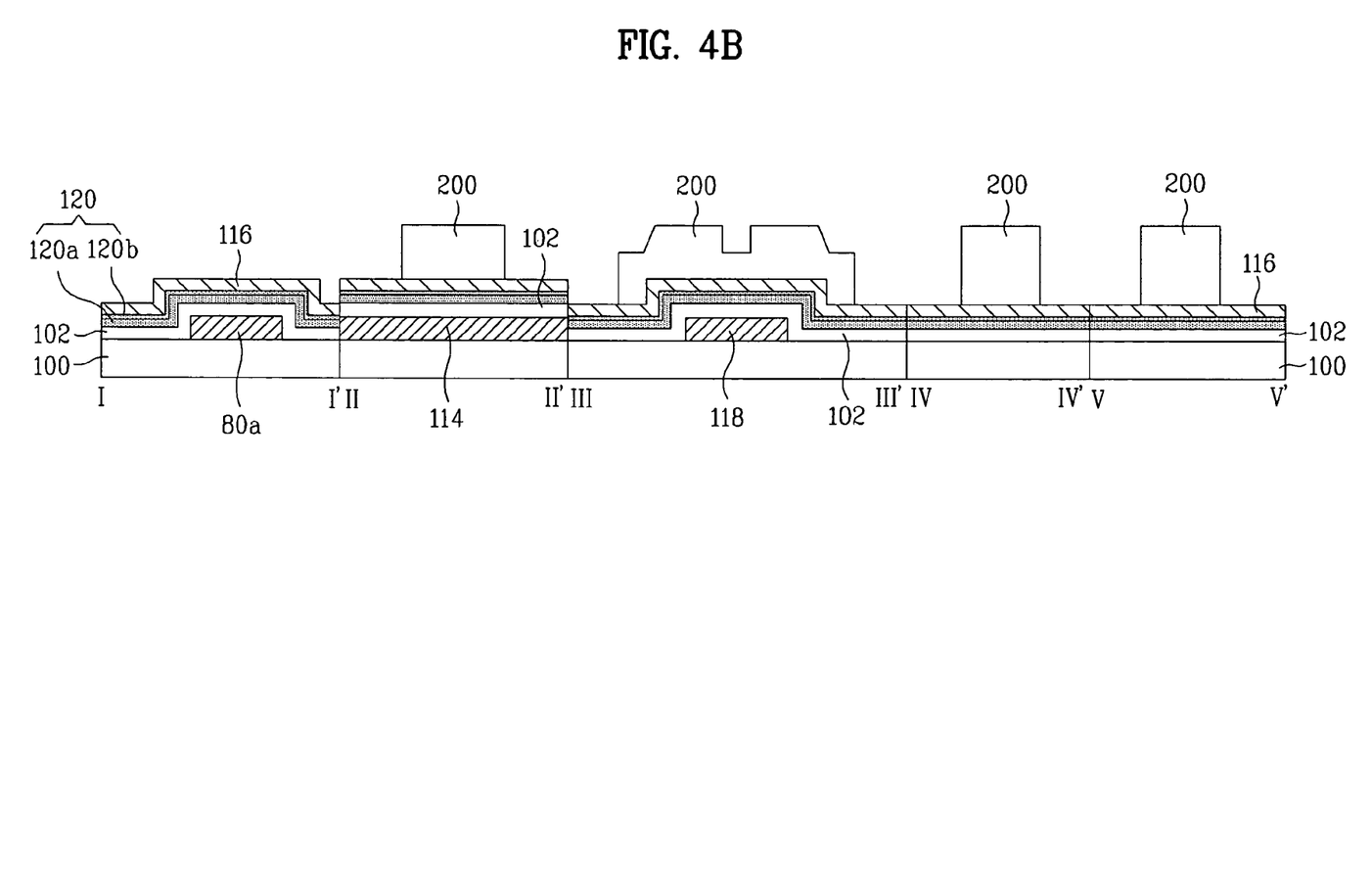

Then, as illustrated in FIG. 4B, the gate insulation layer 102, the semiconductor layer 120 including the active layer 120a and ohmic contact layer 120b, and a source and drain metal layer 116 are sequentially formed on the substrate 100 over the gate pattern.

The gate insulation layer 102 may be formed of an inorganic insulation material of silicon oxide ($SiO_x$) or silicon nitride ($SiN_x$). Also, the source and drain metal layer 116 may be formed in a single-layered structure or multi-layered structure of molybdenum (Mo), titanium (Ti), tantalum (Ta), molybdenum alloy (Mo alloy), copper (Cu), aluminum (Al) or aluminum neodymium (AlNd).

Then, a photoresist layer (not shown) is formed on the source and drain metal layer 116. Thereon, a second mask (not shown) using a diffraction mask or a half-tone mask is provided. In this case, the second mask includes a closed part to block the incident light; a semi-transmission part or diffraction part to transmit the incident light partially; and a transmission part to transmit the incident light.

As the photoresist layer is exposed and developed using the second mask, a first photoresist pattern 200 is formed at different thicknesses, wherein the first photoresist pattern 200 is positioned on the predetermined portions including the lower data pad 90a, the source and drain electrodes 116a and 116b, and the data line 112. In other words, the predetermined portion of first photoresist pattern 200 to separate the source and drain electrodes from each other is made relatively thinner. (Indented region shown in FIG. 4B).

Figure 4C:
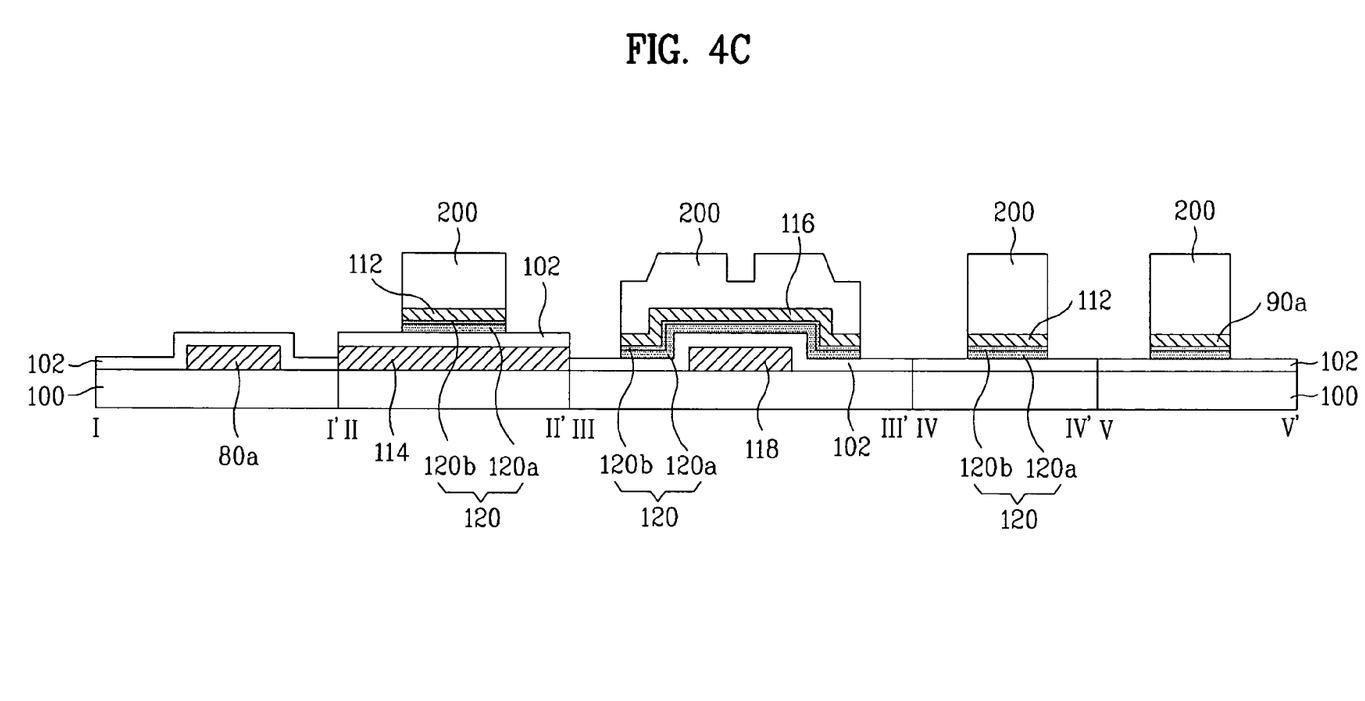

As illustrated in FIG. 4C, the source and drain metal layer 116, except the portion for the source and drain pattern, is removed by wet etching using the first photoresist pattern 200 as a mask. Then, the semiconductor layer 120 except the portion for the semiconductor pattern is removed by the dry etching using the first photoresist pattern 200 as a mask.

Figure 4D:
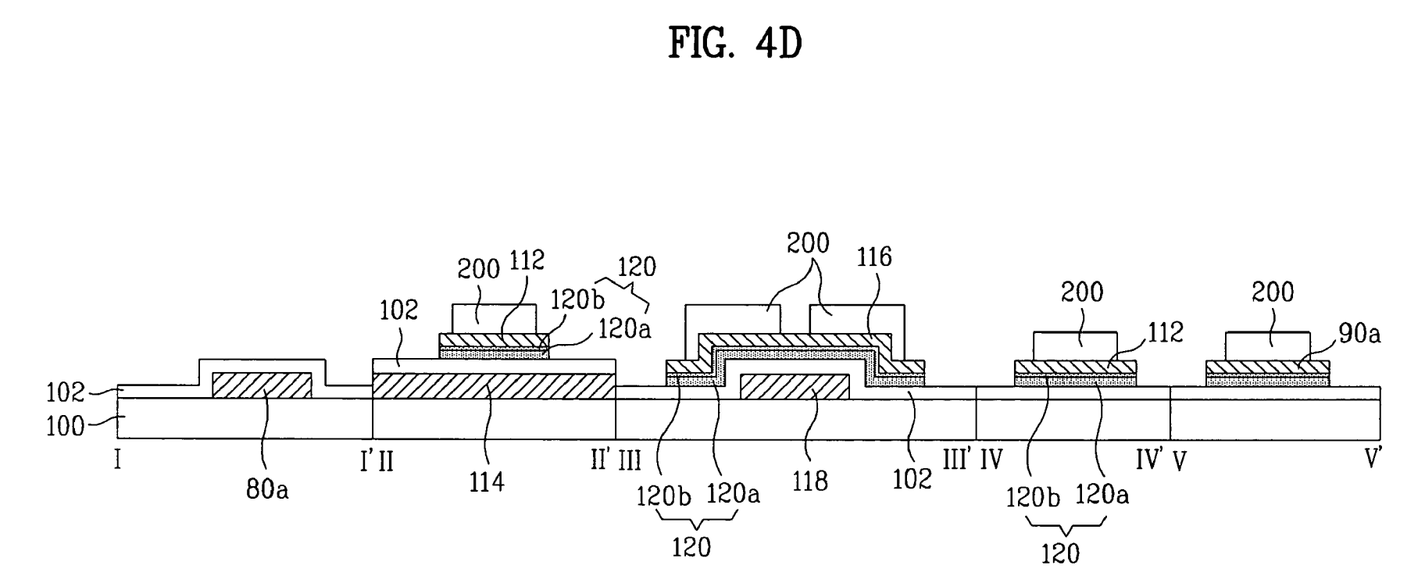

As illustrated in FIG. 4D, the thickness of first photoresist pattern 200 is decreased by ashing. Therefore, the predetermined portion of first photoresist pattern 200 to separate the source and drain electrodes from each other is removed.

Figure 4E:
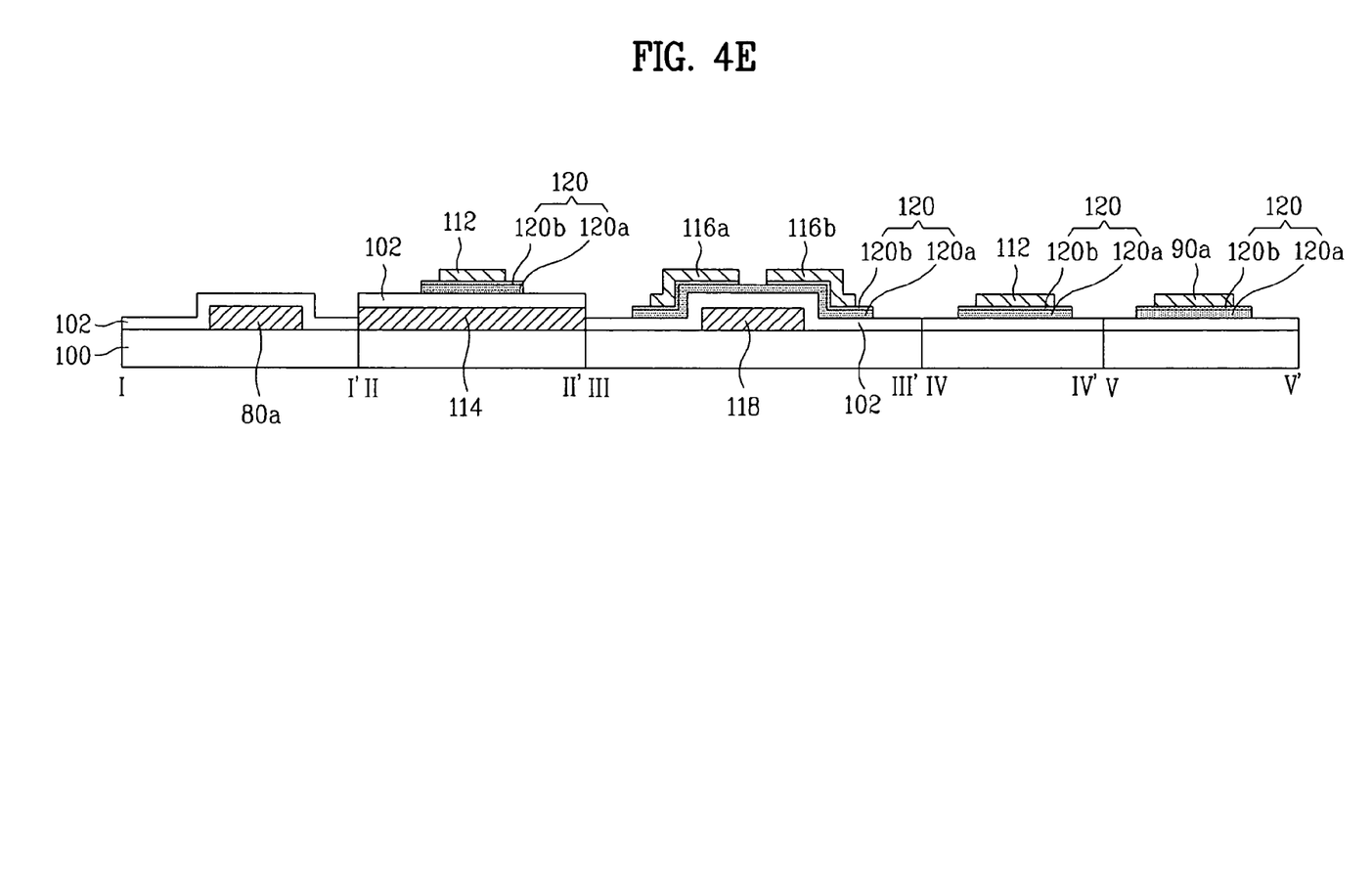

As illustrated in FIG. 4E, the source and drain pattern is wet-etched using the first photoresist pattern 200 as a mask, so that the source and drain electrodes 116a and 116b are separated from each other. Then, the ohmic contact layer 120b exposed by the dry etching is removed. At this time, the source and drain electrode pattern is formed by the wet-etching processes of two times. Thus, the width of data line 112 is smaller than the width of semiconductor layer 120 positioned therebelow, and the width of source and drain electrodes 116a and 116b is smaller than the width of semiconductor layer 120 positioned therebelow.

For example, if the data line 112 is formed of the dry-etchable metal of molybdenum (Mo), the semiconductor layer 120 positioned below the data line 112 is protruding about 1~3 μm at both sides of the data line 112. In the meantime, if the data line 112 is formed of the wet-etchable metal of copper (Cu), the semiconductor layer 120 positioned below the data line 112 is protruding about 3~5 μm at both sides of the data line 112. In this case, the difference between the line width of semiconductor layer 120 and the line width of data line 112 formed by the wet-etchable metal of copper (Cu) is larger than the difference between the line width of semiconductor layer 120 and the line width of data line 112 formed by the dry-etchable metal of molybdenum (Mo).

Figure 4F:
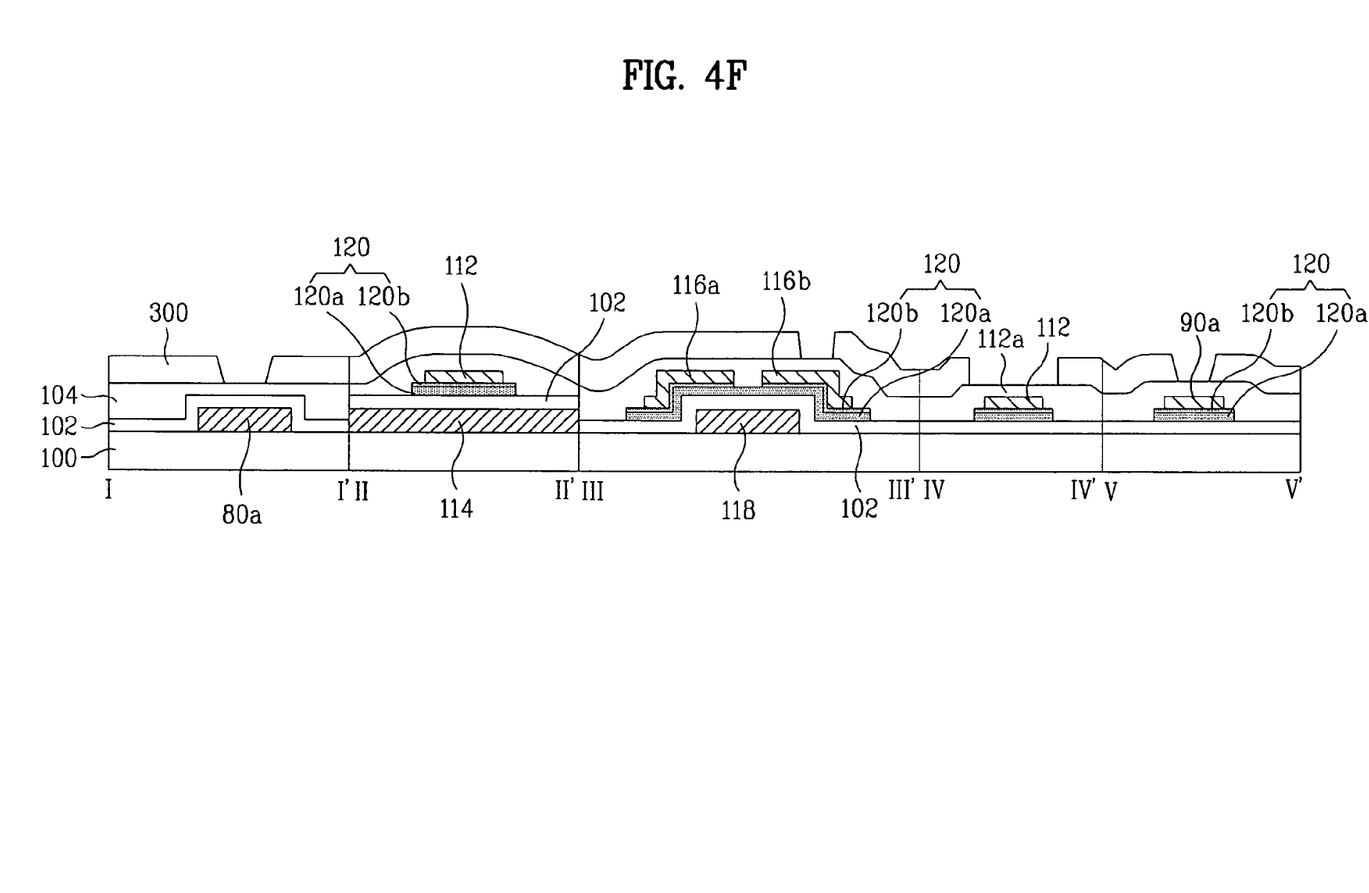

As shown in FIG. 4F, a passivation layer 104 is formed on an entire surface of the substrate including the lower gate pad 80a and the source and drain pattern. The passivation layer 104 may be formed of the inorganic insulation material which is the same as the gate insulation layer 102; the acrylic-based organic compound of which dielectric constant is small; or the organic insulation material of BCB or PFCB.

Then, a photoresist layer (not shown) is formed on the passivation layer 104, and is then exposed and developed using a third mask. As a result, a second photoresist pattern 300 is formed, which exposes the predetermined portions of passivation layer 104 provided on the lower gate pad 80a, the drain electrode 116b, the data line 112 and the lower data pad 90a.

Figure 4G:
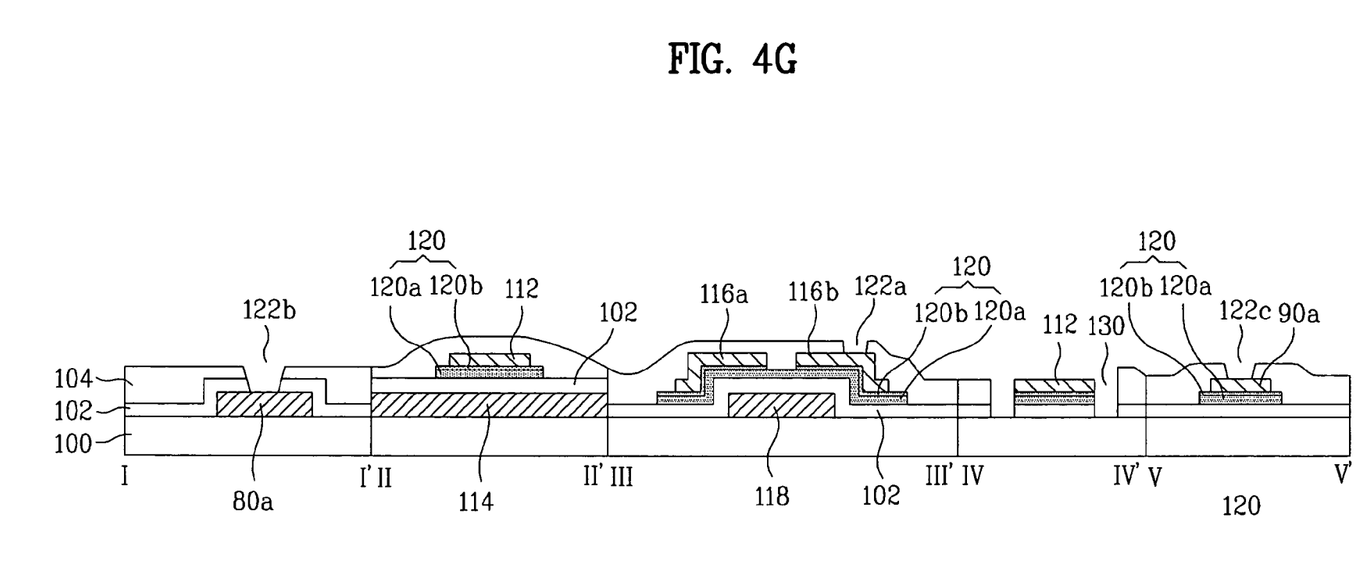

As shown in FIG. 4G, the first to third contact holes 122a, 122b and 122c and line hole 130 are formed through an etching process using the second photoresist pattern 300 as a mask. After the etching process, the first contact hole 122a exposes the drain electrode 116b through the passivation layer 104; the second contact hole 122b exposes the lower gate pad 80a through the passivation layer 104 and the gate insulation layer 102; the third contact hole 122c exposes the lower data pad 90a through the passivation layer 104; and the line hole 130 exposes the upper and lateral sides of data line 112 through the passivation layer 104 and gate insulation layer 102, and exposes the lateral side of semiconductor layer 120 positioned therebelow, and the upper surface of substrate 100.

An etching process is also carried out to remove portions of the semiconductor layer 120 protruding beyond the data line 112 in area exposed by the line hole 130. By removing the passivation layer 104 exposed by the second photoresist pattern 300; and the semiconductor layer 120 protruding at both sides of the data line 112 when forming the line hole 130, the line width of semiconductor layer 120 positioned below the data line 112 between the adjacent pixel electrodes 124 is identical to the line width of data line 112. Also, the passivation layer remains at the crossing of the gate line 114 and the data line 112, to thereby prevent the semiconductor layer 120 and the gate insulation layer 102 positioned below the data line 112 from being etched.

In order to form the line hole shown in FIG. 3, a slit mask or a half-tone mask is used. Following is the example using the slit mask. The slit mask is formed of a transmission part corresponding to first to third contact holes 122a, 122b and 122c; a slit part corresponding to the line hole 130; and a closed part corresponding to the passivation layer 104.

Through the etching process using the photoresist pattern formed by the exposure and development using the slit mask, the first to third contact holes 122a, 122b and 122c are formed and the line hole 130 passing through the passivation layer 104 is formed. When forming the line hole 130, the semiconductor layer 120 protruding at both sides of data line 112 is removed so that the semiconductor layer 120 positioned below the data line has the same line width as that of the data line 122.

Figure 4H:
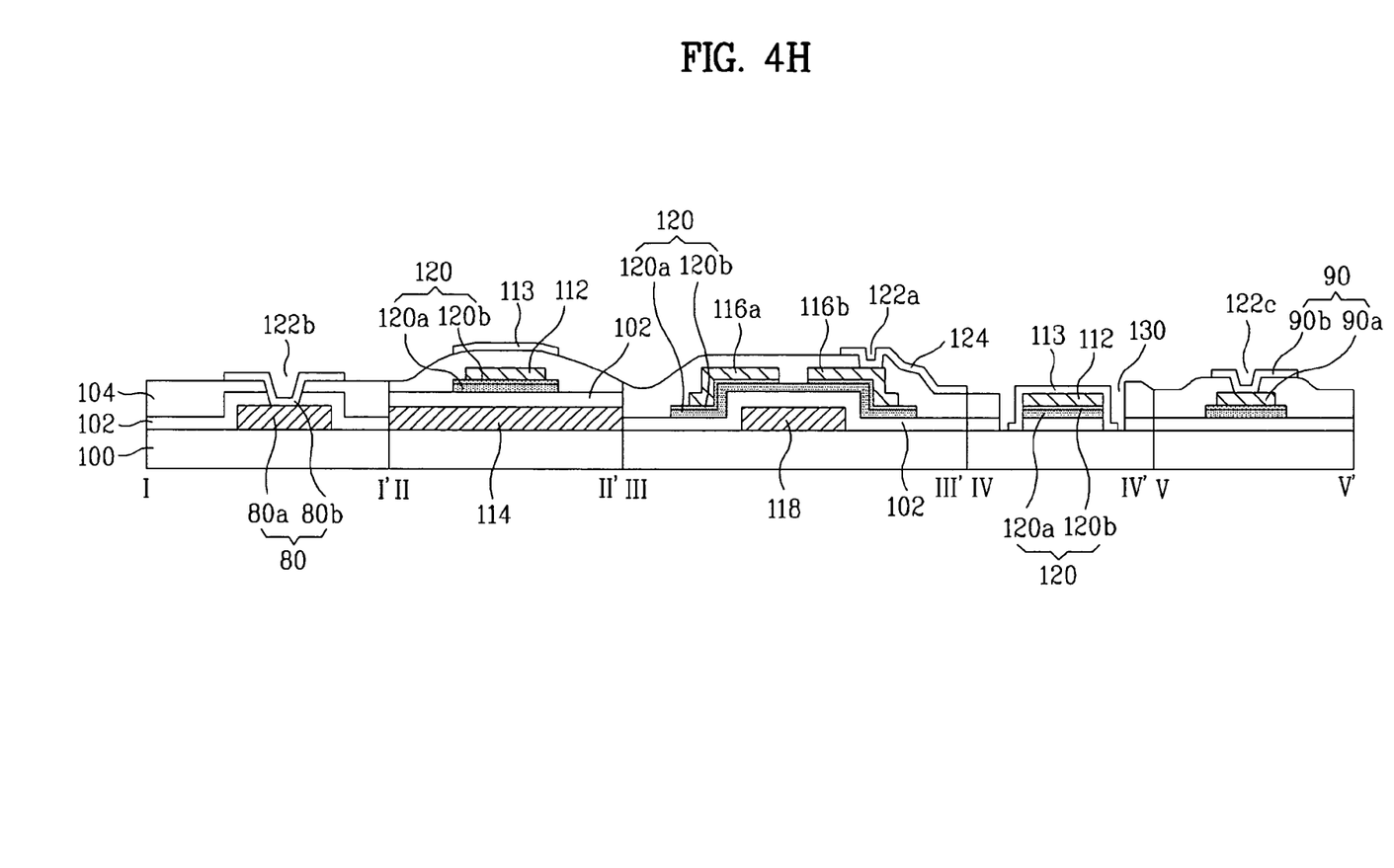

As illustrated in FIG. 4H, the first to third contact holes 122a, 122b and 122c and the line hole 130 are formed. A transparent conductive material (not shown) is deposited on the passivation layer 104 to cover the data line 112. The transparent conductive material may be formed of Indium Tin Oxide (ITO), Tin Oxide (TO), Indium Zinc Oxide (IZO), or Indium Tin Zinc Oxide (ITZO).

Then, a transparent conductive pattern including the pixel electrode 124, the data protection pattern 113, the upper data pad 90b and the upper gate pad 80b is formed by photolithography and etching using a fourth mask (not shown).

The data protection pattern 113 covers the lateral side of semiconductor layer 120 and the upper and lateral sides of data line 112 exposed by the line hole 130. Also, the data protection pattern 113 overlies the data line 112 with the passivation layer 104 therebetween where the data line 112 crosses over the gate line 114.

The data protection pattern 113 is formed to prevent the semiconductor layer 120 and data line 112 exposed by the line hole 130 from being etched by an etchant used when forming the pixel electrode 124.

As mentioned above, the LCD device according to the present invention and the method of fabricating the same have the following advantages.

In the LCD device according to the present invention and the method of fabricating the same, the line width of semiconductor layer underlying the data line is decreased so that the area of pixel electrode is increased in proportion to the decreased line width of semiconductor layer, thereby improving the aperture ratio of LCD device.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

The invention claimed is:
1. An LCD device comprising:
a substrate including a plurality of gate lines and a plurality of data lines crossing each other to define a plurality of pixel regions on the substrate;
a thin film transistor (TFT) formed at crossing portions of the gate lines and the data lines, each TFT including a semiconductor layer electrically coupled to a corresponding data line and a drain electrode electrically coupled to a pixel electrode, wherein the data lines and the semiconductor layer comprise a composite line in regions on the substrate between adjacent pixel electrodes;
a passivation layer overlying the gate lines, the data lines, and the TFT;
a line opening exposing top surface and sidewalls of the data lines and sidewalls of the semiconductor layer between adjacent pixel electrodes through the passivation layer, and
a data protection layer covering the composite line and overlying the data line with the passivation layer therebetween where the data line crosses over the gate line, the data protection layer formed on the same layer as the pixel electrode where the data line crosses over the gate line, wherein a line width of the data line is substantially the same as a line width of the semiconductor layer in the composite line.

2. The LCD device of claim 1, wherein the composite line extends on the substrate beyond an edge of the pixel electrode to a data pad, and wherein opposite edges of the semiconductor layer protrude beyond opposite edges of the data line at the data pad.

3. The LCD device of claim 2 wherein a position at which the opposite edges of the semiconductor layer protrude beyond the opposite edges of the data line is substantially coincident with the edge of the pixel electrode.

4. An LCD device comprising:
a substrate including a gate line and a data line crossing each other to define a pixel region on the substrate;
a thin film transistor (TFT) formed at a crossing portion of the gate line and the data line, the TFT including a gate electrode connected to the gate line, a gate insulation layer overlying the gate electrode, a semiconductor layer overlying the gate insulation layer, a source electrode overlying the semiconductor layer and connected to the data line, and a drain electrode;
a pixel electrode connected to the drain electrode;
a passivation layer overlying the gate line, the data line, and the TFT;
a line opening exposing top surface and sidewalls of the data lines and sidewalls of the semiconductor layer in the region between adjacent pixel electrodes through the passivation layer, and
a data protection layer covering the top surface and sidewalls of the data lines and sidewalls of the semiconductor layer exposed by the line opening and overlying the data line with the passivation layer therebetween where the data line crosses over the gate line, the data protection layer formed on the same layer as the pixel electrode where the data line crosses over the gate line,
wherein a portion of the data line overlies a portion of the semiconductor layer in a region adjacent to the pixel electrode, and
wherein a line width of the data line is substantially the same as a line width of the semiconductor layer in the region adjacent to the pixel electrode.

5. The LCD device of claim 4, wherein the data line and the semiconductor layer extend on the substrate beyond an edge of the pixel electrode to a data pad, and wherein opposite edges of the semiconductor layer protrude beyond opposite edges of the data line at the data pad.

6. The LCD device of claim 5 wherein a position at which the opposite edges of the semiconductor layer protrude beyond the opposite edges of the data line is substantially coincident with the edge of the pixel electrode.

7. The LCD device of claim 4, wherein the data line and the semiconductor layer and the gate insulation layer comprise a composite layer in the region adjacent to the pixel electrode, the composite layer having a top surface and sidewalls, and wherein the data protection layer overlies the top surface and the sidewalls of the composite layer.

8. The LCD device of claim 4, wherein the data line, and the source and drain electrodes comprise at least one of molybdenum (Mo), titanium (Ti), tantalum (Ta), molybdenum alloy (Mo alloy), copper (Cu), aluminum (Al) or aluminum neodymium (AlNd).

9. The LCD device of claim 4, wherein the gate insulating layer comprises silicon oxide or silicon nitride.

10. An LCD device comprising:
a plurality of gate lines and a plurality of data lines crossing each other to define a plurality of pixel regions on a substrate;
a thin film transistor formed on the substrate, the thin film transistor including a gate electrode, a gate insulating layer, an active layer, an ohmic contact layer, a source electrode and a drain electrode;
a semiconductor pattern interposed between the gate insulating layer and the date line, a width of the semiconductor pattern is substantially the same as a width of the date line;
a passivation layer formed on the gate lines and the thin film transistor, the passivation layer including contact holes to expose a portion of the drain electrode and the date line;
a pixel electrode formed on the passivation layer, the pixel electrode electrically connected to the drain electrode through the contact hole, and
a data protection layer covering the data line exposed by the contact hole and overlying the data line with the passivation layer therebetween where the data line crosses over the gate line, the data protection layer formed on the same layer as the pixel electrode where the data line crosses over the gate line.

11. The LCD device of claim 10, wherein the data line, and the source and drain electrodes comprise at least one of molybdenum (Mo), titanium (Ti), tantalum (Ta), molybdenum alloy (Mo alloy), copper (Cu), aluminum (Al) or aluminum neodymium (AlNd).

* * * * *